(12) United States Patent
Sugimoto et al.

(10) Patent No.: US 7,173,827 B2
(45) Date of Patent: Feb. 6, 2007

(54) PRINTED BOARD AND METER UNIT PROVIDED THEREWITH

(75) Inventors: Yuji Sugimoto, Okazaki (JP); Syuichi Kouno, Okazaki (JP); Tomoyuki Miyagawa, Nukata-gun (JP)

(73) Assignees: Nippon Soken, Inc., Nishio (JP); Denso Corporation, Kariya (JP)

( * ) Notice: Subject to any disclaimer, the term of this patent is extended or adjusted under 35 U.S.C. 154(b) by 328 days.

(21) Appl. No.: 10/721,295

(22) Filed: Nov. 26, 2003

(65) Prior Publication Data

US 2004/0114335 A1 Jun. 17, 2004

(30) Foreign Application Priority Data

Nov. 29, 2002 (JP) ............................. 2002-348517

(51) Int. Cl.
- H05K 7/02 (2006.01)
- H05K 7/06 (2006.01)
- H05K 7/08 (2006.01)
- H05K 7/10 (2006.01)

(52) U.S. Cl. ................. 361/760; 361/752; 361/816; 361/818

(58) Field of Classification Search ........ 361/752–753, 361/816–818, 792–794; 340/426.13, 426.34

See application file for complete search history.

(56) References Cited

U.S. PATENT DOCUMENTS 4,801,489 A 1/1989 Nakagawa et al.
5,043,526 A 8/1991 Nakagawa et al.
6,185,105 B1 * 2/2001 Inoguchi ..................... 361/760
6,239,982 B1 5/2001 Bozzer et al.
6,333,697 B1 * 12/2001 Kumazawa et al. ..... 340/815.4
6,812,942 B2 * 11/2004 Ribak ......................... 345/30
2003/0112617 A1 6/2003 Ueno et al.
2004/0145876 A1 7/2004 Romahn

FOREIGN PATENT DOCUMENTS

GB 2 265 760 A 10/1993
JP A-S63-015497 1/1988

OTHER PUBLICATIONS

Office Action and its translation from Korean Patent Office dated Sep. 22, 2005.

* cited by examiner

Primary Examiner—Elvin Enad
Assistant Examiner—Tuan Dinh
(74) Attorney, Agent, or Firm—Posz Law Group, PLC

(57) ABSTRACT

A printed board has a board, an electrically insulative membrane, formed on the board, and an electrically conductive membrane, formed on the electrically insulative membrane, in its area where a control circuit, including a CPU and etc., is installed. The electrically conductive membrane is electrically connected with ground patterns of a wiring pattern. Accordingly, ground connections at the control circuit are sufficiently performed. Therefore, even though ground connections in an area other than the control circuit are not sufficiently performed, a magnetic noise is prevented from being generated in a loop-shaped electricity supply line passing through a CPU and etc. Consequently, noises in printed board can be effectively reduced.

13 Claims, 5 Drawing Sheets

NOISE SPECTRUM WAVE FORM

PRINTED BOARD AND METER UNIT PROVIDED THEREWITH

CROSS REFERENCE TO RELATED APPLICATION

This application is based on Japanese Patent Application No. 2002-348517 filed on Nov. 29, 2002, the disclosure of which is incorporated herein by reference.

FIELD OF THE INVENTION

The present invention relates to a printed board and a meter unit provided therewith, and more particularly relates to the structure thereof for reducing a generated noise.

BACKGROUND OF THE INVENTION

Recently, an automobile is provided with an electric wave receiving device other than a car radio, e.g., an electric wave receiving device for a keyless entry system. The keyless entry system is a control device for opening or closing a door of a vehicle and includes a keyless entry receiver installed inside the vehicle and a keyless entry transmitter installed inside a key, etc. The keyless entry transmitter transmits a signal with an ID code associated with the transmitter and a modulated operational command code, when operated. When the keyless entry receiver has received the transmitted signal, the receiver demodulates the signal and determines whether the ID code is its corresponding one or not. When determined to be the corresponding one, an operation signal corresponding to the operation command code is sent to a control ECU of a corresponding component of the vehicle, thereby opening or closing the door or starting an engine. Such a keyless entry system mainly utilizes micro electric waves that are about 300 MHz. The keyless entry receiver is preferable to be installed in a position where electric waves are efficiently received. The position is remarkably in a meter unit. It is a trend that the position is a meter unit. For example, a meter unit integrated with an electric wave receiver is diffused.

In a meter unit, a meter circuit is formed on a printed circuit board, and the circuit board is housed by a meter housing. The meter circuit control indicative content indicated in an indicative portion correspondingly to actual driving state of a vehicle. Recently, the meter unit is however provided with a CPU similarly to the other electric devices, thereby accomplishing advanced indicative performance. However, the CPU, which is operated on the basis of a high-frequency clock signal, is a high-frequency signal source. Therefore, the CPU serves as a noise source in the same frequency range as the clock signal and the higher harmonics wave thereof. Accordingly, the keyless entry system is erroneously operated, and the operational frequency range of the electric wave receiver is disadvantageously narrowed.

Noise reduction technology for reducing noise in the printed board is disclosed in JP-B2-H6-34472. In this printed board, an insulative layer is formed on a board so as to cover a conductive layer, serving as a wiring pattern, excluding an earth (ground) pattern. Moreover, a shielding electrode layer, such as copper powder, is formed thereon. By virtue of electromagnetic wave shielding performance thereof, a dispensable radiation noise is reduced.

However, in the printed board, since the shielding electrode layer is formed so as to cover the conductive layer excluding the earth pattern, the insulating layer and the shielding electrode layer are formed on the substantially whole surface of the board. Therefore, this is hard to be practical.

SUMMARY OF THE INVENTION

The present invention is considered in view of the above circumstance, and the purpose is to provide a printed board that is practical and adequately effective for reducing its noise and a meter unit provided therewith.

According to the present invention, a printed board comprises a board, a plurality of circuit components, a wiring pattern and a high frequency circuit. The circuit components are installed in the board. The wiring pattern electrically connects between the circuit components and includes at least one ground pattern. The electric regulator supplies a predetermined amount of electricity. The electric regulator is installed in the board. The high frequency circuit is installed in the board and operated by the electricity. The high frequency circuit includes a high frequency signal source and at least one mounting component, the printed board is characterized by comprising an electrically insulative membrane and an electrically conductive membrane. The electrically insulative membrane is installed on an area of the board where the high frequency circuit is installed and includes at least one component hole pattern, which surrounds one of the high frequency signal source and the mounting component, and at least one connection hole pattern. The electrically conductive membrane is installed on the electrically insulative membrane and includes the component hole pattern in a position corresponding to the component hole pattern of the electrically insulative membrane. The electrically conductive membrane is electrically connected with the ground pattern through the connection hole pattern.

The electrically conductive membrane has the component hole pattern surrounding the high frequency signal source or the mounting component, and the electrically conductive membrane forms a ground connected portion extended not linearly but flatly on the area where the high frequency circuit is formed. Accordingly, the grounded area can be secured more sufficiently than the linear one, and the area where the high frequency circuit serving as a noise source is installed can be grounded more enough. Therefore, even though the electrically conductive membrane is not formed in the area where the high frequency circuit is not installed, the noise is less likely to be conducted to the wiring pattern disposed in the area where the high frequency circuit is not formed, thereby restraining dispensable radiation noise from being generated. Consequently, the noise can be sufficiently effectively reduced similarly to a printed board where the electrically conductive membrane is fully formed. In addition, the electrically insulative membrane and the electrically conductive membrane are formed in a limited area, thereby advancing the practicability.

Moreover, according to the present invention a printed board comprises a board, a plurality of circuit components, a wiring pattern, an electric regulator and a high frequency circuit. The circuit components are installed in the board. The wiring pattern electrically connects between the circuit components and includes a plurality of ground patterns. The electric regulator supplies a predetermined amount of electricity and is installed in the board. The high frequency circuit is installed in the board and operated by the electricity. Moreover, the high frequency circuit includes a high frequency signal source and at least one mounting component. The printed board is characterized in that the ground patterns includes a loop-shaped closed ground pattern and a plurality of connective ground patterns, each of which is disposed inside the loop-shaped closed ground pattern and connects between two parts of the loop-shaped closed ground pattern.

The loop-shaped closed ground pattern restrains a magnetic noise more effectively than one in which the ends are not connected. Moreover, the connective ground patterns reduce the ground resistance, thereby restraining the ground patterns serving as an antenna. Accordingly, the noise can be sufficiently effectively reduced similar to one having a board in which the electrically conducive membrane is fully formed. In addition, the pattern can be formed not to be flatly extended but to be linearly extended, thereby simplifying the structure and advancing the practicability.

Furthermore, according to the present invention, a meter unit for a vehicle comprises a meter housing, an indicative portion and a printed board. The indicative portion is disposed in a manner that opposes a passenger in the vehicle and indicates driving information of the vehicle. The printed board is installed inside the meter housing and includes a meter circuit for controlling a content indicated in the indicative portion correspondingly to an actual driving state of the vehicle. The printed board is essentially composed of the above described printed board.

Accordingly, a dispensable radiation noise caused by the high frequency signal source can be efficiently reduced.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE PRESENTLY PREFERRED EMBODIMENTS (First Embodiment)

Figure 2:
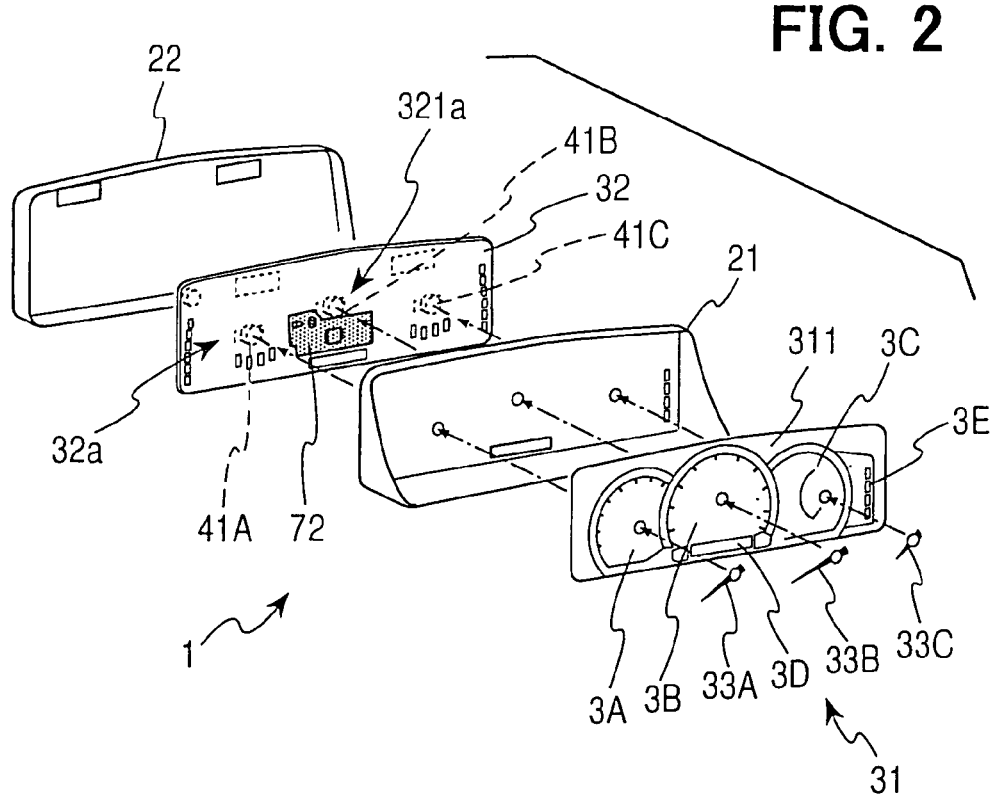
FIG. 2 is a perspective view of the decomposed components of a meter-unit according to the present invention.

As shown in FIG. 2, the meter unit 1 is provided with -an upper housing 21 to be fitted into an instrument panel of a passenger compartment and a lower housing 22. An indicative portion 31 is attached to the upper housing 21 on its passenger side. A transparent clear housing (not shown) is disposed in front of the indicative portion 31 and covers the indicative portion 31 in front thereof. Meter devices, such as meters 3A, 3B, 3C, 3D, are arranged in the indicative portion 31 and indicate driving information or the like of a vehicle for a passenger of the vehicle. Over the back side of an indicative board 311 of the indicative portion 31, the side being on the opposite side as a passenger, a printed board 32 is installed.

Figure 1:
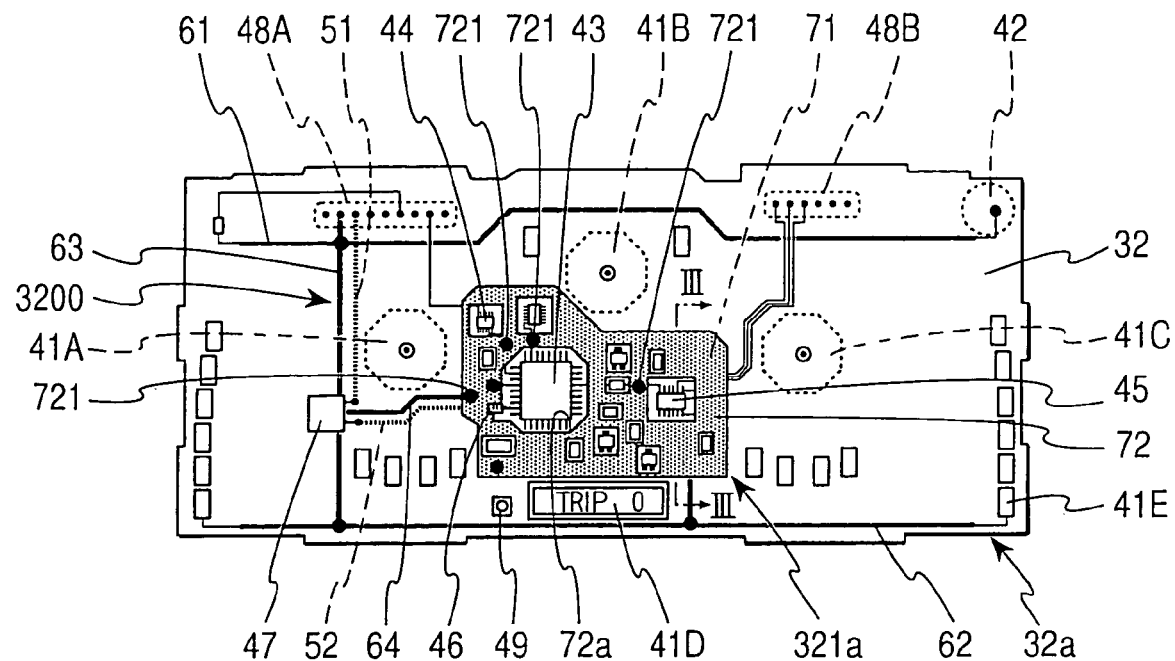
FIG. 1 is a diagram showing a component arrangement of a printed board of a meter unit according to a first embodiment of the present invention.

As shown in FIG. 1, with respect to arrangement of the meters 3A–3D, a speed meter 3B is disposed in the substantial center, a tachometer 3A is disposed on the left thereof, and a little smaller fuel meter 3C is disposed on the right. Moreover, a trip meter 3D, which is a liquid crystal display, is disposed in a lower part of the speedmeter 3B. Further, in the right end portion of the indicative board 311, a plurality of indicator lamps 3E are arranged, each of which indicates the state of a corresponding vehicle component, for example, a state whether a seat belt is buckled or not. Indicative pointers 33A–33C are respectively attached to the ends of the shafts of stepping motors 41A, 41b, 41C, thereby respectively indicating predetermined angle positions. The shafts penetrate through the indicative board 311 and rotationally control the positions of the pointers 33A–33C by the stepping motors 41A–41C. Moreover, a liquid crystal display switching button (not shown) is provided and can reset a value indicated on the trip meter 3D. The end of the button penetrates through the clear housing and projects toward the passenger.

As shown in FIG. 1, the printed board 32 is a generic printed board, which is formed of a variety of insulating materials, such as a glass epoxy material, to be a substantial rectangular shape elongated sideways, and thereon a variety of wiring patterns 3200 are formed by way of etching of a copper foil. On the surface of the printed board 32, a variety of components 41A–41E, 42, 43, 44, 45, 46, 47, 48A, 48B, 49, etc. are installed, thereby forming a meter circuit 32a for controlling indicative information indicated on the indicative portion 31 and on the basis of the actual driving state of the vehicle.

The installed components 41A–49 includes the stepping motor 41A–41C, a liquid crystal display panel 41D, which constitutes the trip meter 3D, a plurality of LEDs 41E, which constitute the indicator lamps 3E, a buzzer 42 and a reset switch 49. The reset switch 49 is switched in response to a pushed action of the liquid crystal display switching button. Moreover, a parallel-serial conversion IC 45 for switching a parallel signal outputted from a communicative IC 44 and a CPU 43 into a serial signal is installed. The IC 45 constitutes a control circuit 321a serving as a high frequency circuit. Drive signals of the actuators etc. 41A–42 and detection signals of the switch 49 are inputted and outputted in the control circuit 321a. A communicative IC 44, the CPU 43 and control ECUs installed in respective control devices of the vehicle constitute a communication network, in which the communicative IC 44 is used for making the CPU 43 and the control ECUs communicate data therebetween. The communication network is a multiplex communication system, in which the communicative IC 44 communicates data with the CPU 43 and simultaneously communicates data flames through communicative lines that connect the CPU 43 with the control ECUs in accordance with a predetermined communication protocol.

The control circuit 321a is constituted with the CPU 43, in which these high frequency signals are processed, the communicative IC 44, the parallel-serial conversion and moreover resistors and capacitors connected therewith. For example, a bypass condenser 46 is installed.

In the printed board 32, a battery regulator 47 for supplying electricity to each component of the control circuit 321*a* is further installed. The battery regulator 47 converts 12 volts electricity of a battery into predetermined 5 volts electricity, and its input terminal is connected with a connector 48A for supplying electricity through an electricity supply line 51, and its output terminal is connected with an electricity supply line 52, which reaches electric terminals of the ECU 43, etc. moreover, as a wiring pattern 3200, ground lines 61, 62, 63, 64 are formed. The ground lines 61, 62 are respectively formed to be extended along an upper edge and a lower edge of the rectangular printed board 32, and the lengths of the ground lines 61, 62 are substantially the same as the lengths of the upper and the lower edges of the printed board 32. The ground line 63 is formed to be extended from the connector 48A through the ground terminal position of the battery regulator 47 in a direction perpendicular to the ground lines 61, 62. Both terminals of the ground line 63 are connected with the ground lines 61, 62.

To the upper edge portion of the printed board 32, connectors 48B associated with vehicle information are attached. The connectors 48B associated with the vehicle information are used to be connected with communication lines of the communication network and for outputting the serial signals.

To the CPU 43, which is disposed in the center of the control circuit 321*a*, driving information concerning, e.g., driving speed, the amount of remaining fuel and the rotation speed of the engine are inputted. On the basis of the inputted driving information, the control signals are outputted to the stepping motors 41A–41C, the liquid crystal display panel 41D, etc.

Figure 4:
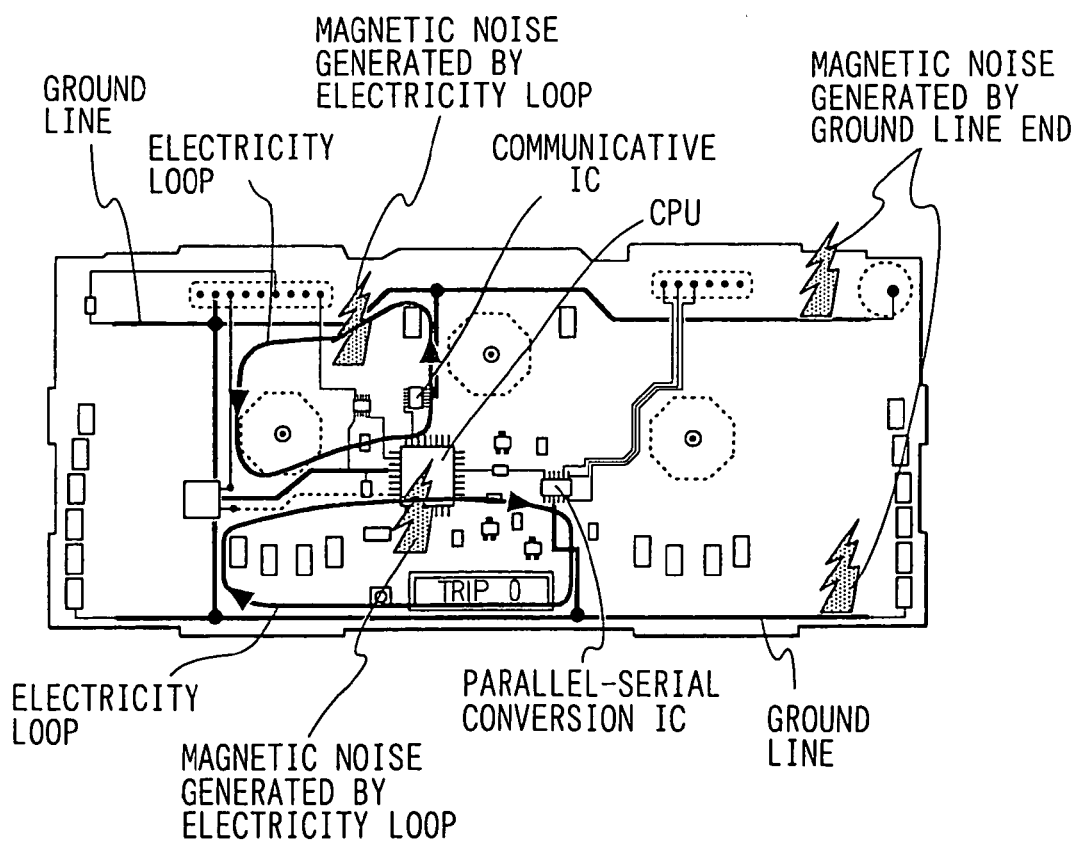
FIG. 4 is a diagram showing a component arrangement of a printed board of a meter unit according to a prior art, illustrating problems, etc. thereof.

The CPU 43 generates a clock signal serving as a high frequency signal and can be a noise source in a frequency range of the clock signal and harmonics thereof. Moreover, in the communicative IC 44, which communicates data with the CPU 43, and the conventional parallel-serial conversion IC 45, noise electricity from the CPU 43 is conventionally disadvantageously likely to flow through a wiring pattern that is connected with the CPU 43 and serves as a data transmission line. Therefore, for example, as shown in FIG. 4, the magnetic noise is disadvantageously likely to be generated in an electricity loop of CPU—communicative IC—wiring pattern—battery regulator—wiring pattern—CPU and another electricity loop of CPU—parallel-serial conversion IC-wiring pattern-CPU. Hereinafter, a method for reducing superfluous radiation noise in the meter unit will be described. In this connection, the frequency range of the noise to be restrained is a range in which a system is erroneously activated. For example, when a keyless entry system is employed, the frequency range is about 300 MHz. When the CPU 43 generates clock signals: or harmonics thereof within the frequency range, the CPU 43 becomes a noise source.

Figure 3:
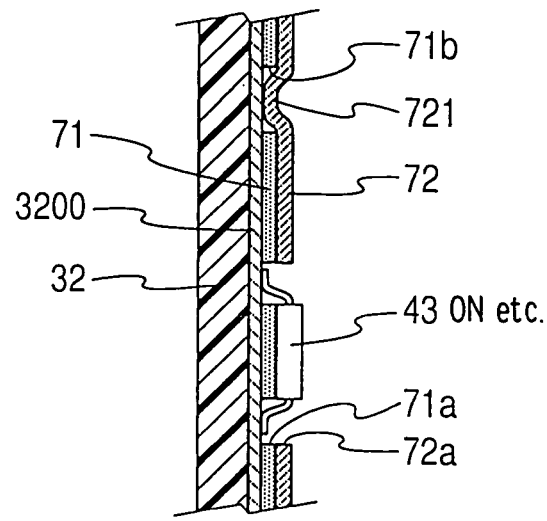
FIG. 3 is a cross-sectional view taken along the plane A—A of FIG. 1.

In a part of the printed board 32 where the control circuit 321*a* is formed, as shown in FIG. 3, an electrically insulative membrane 71 is formed on the printed board 32. The electrically insulative membrane 71 has a hole pattern, in which a component of the control circuit 321*a*, e.g., the CPU 43 (hereinafter, referred to as control circuit component 43 or etc. according to need) is electrically connected with the wiring pattern 3200 and fixed to the printed board 32. The electrically insulative membrane 71 is, for example, coated with a solder resist and can be formed in a predetermined area by, for example, the silk screen printing.

An electrically conductive membrane 72 is formed on the electrically insulative membrane 71. In the position of the control circuit component 43 or etc., the electrically conductive membrane 72 surrounds the control circuit components 43 or etc. so as to form the component hole pattern 72*a*. The electrically conductive membrane 72 is applied with an electrically conductive paste and is formed to be a predetermined shape by way of the silk screen printing.

Moreover, the electrically insulative membrane 72 has a plurality of connection hole patterns 71*b* in its parts, in which the ground lines are formed, within the area of the control circuit 321*a*. In these parts, the electrically conductive membrane 72 contacts the printed board 32. More specifically, the connection hole patterns 71*b* serve as connecting points 721, where the electrically conductive membrane 72 is electrically connected with the ground lines. For example, the hole pattern 71*a* of the electrically insulative membrane 71 is positioned at the end of the ground line 64 in which the battery regulator 47 and the control circuit 321*a* are to be connected. This point serves as a connecting point 721, thereby electrically connecting between the electrically conductive membrane 72 and the ground line 64.

At the area where the control circuit 321*a* is formed, by virtue of the component hole pattern 72*a* of the electrically conductive membrane 72, surrounding the mounted component, the electrically conductive membrane 72 functions as a ground pattern in a manner that is extended not linearly but flatly so as to wholly cover the control circuit 321*a*. More specifically, it can achieve larger grounding area than one in which the ground patterns are wired linearly, thereby achieving the higher grounding performance. Therefore, decoupling by the bypass condenser 46 can be performed more effectively. Accordingly, for example, even though a loop of the CPU 43—the communicative IC 44—the wiring patterns 61, 63, etc.—the battery regulator 47—the wiring pattern 52, 64, etc.—the CPU 43 or a loop of the CPU 43—the parallel-serial conversion IC 45—the wiring patterns 62, 63, etc.—the battery regulator 47—the wiring patterns 52, 64, etc.—the CPU 43 is formed on the circuit, it is restrained to generate magnetic noises caused by the CPU 43 through the loop serving as a magnetic antenna. In this way, the noise reduction is effectively performed by forming the electrically conductive membrane 72 only in the area of the control circuit 321*a*, in which the CPU 43 serving as the high frequency signal source, the communicative IC 44 communicating data with the CPU 43, the parallel-serial conversion IC 45, etc. are installed.

Moreover, the electrically conductive membrane 72 is not installed in the area where the control circuit 321*a* is not disposed and instead the liquid crystal display panel 41D, the LED 41E, the buzzer 42, the battery regulator 47 and etc. are installed. Therefore, the structure can be simpler than one in which an electrically conductive membrane or an electrically insulative membrane is formed on the substantially whole surface of the printed board 32.

Figure 5:
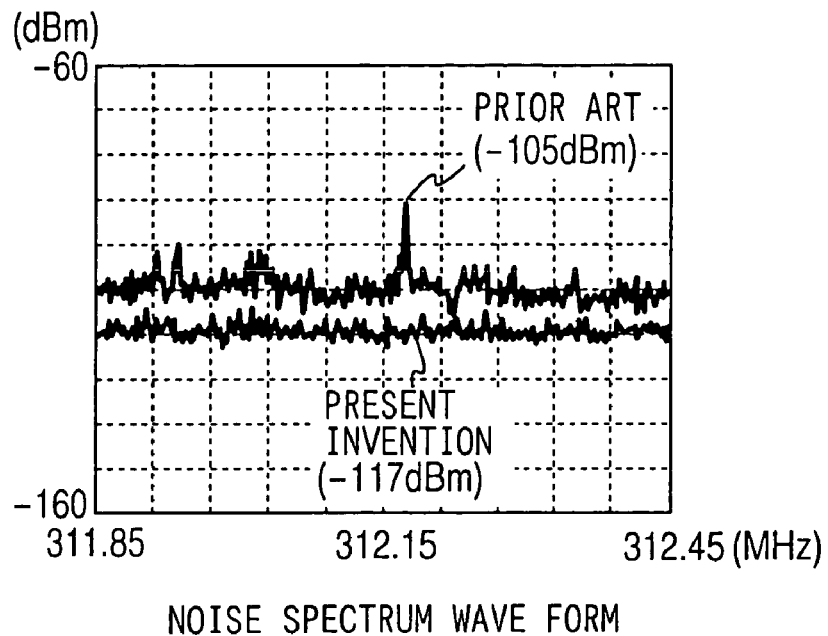
FIG. 5 is a graph in which the present invention and the prior art are compared.

FIG. 5 shows examples of noise spectrums, in which a meter unit according to the present invention and a conventional meter unit having no electrically conductive membranes are compared. These are measured at the upper left point of the printed board. The point is determined to consider the after-mentioned fourth embodiment, where a keyless entry receiver is disposed at the point. However, the effect of the present invention can be achieved at any points. FIG. 5 implies that the noise is reduced by no less than 12 dBm in the present invention better than prior art.

(Second Embodiment)

Figure 6:
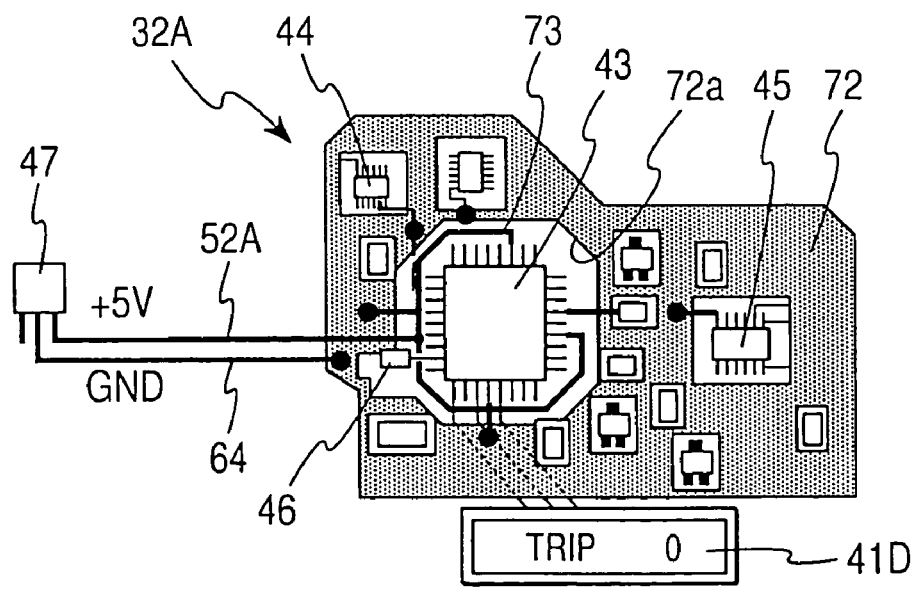
FIG. 6 is a diagram showing a component arrangement of a main part of a printed board of a meter unit according to a second embodiment of the present invention.

A printed board according to the second embodiment will be described with reference to FIG. 6. The basic structure of a meter unit is the same as that according to the first embodiment, and differences between the first and second embodiments will be particularly described.

In a printed board 32A, one end portion on the side of the CPU 43 of an electricity supply line 52A, through which electricity is supplied from the CPU 43 to the electric regulator 47, forms an electrically conductive membrane 73 on the electrically insulative membrane 71 covering the board (hereinafter, according to need, the electrically conductive membrane 73 of the electricity supply line 52A in the vicinity of the CPU 43 is referred to as a paste electricity supply line 73, and the electrically conductive membrane 72 is referred to as a paste ground 72). The paste electricity supply line 73 is positioned inside a component hole pattern 72a of the paste ground 72 and disposed in a C-shape in a manner that surrounds the CPU 43, and is connected with a corresponding terminal of the CPU 43 at a predetermined position.

As described above, the paste ground 72 surrounds the electricity supply line 73, and the paste electricity supply line 73 surrounds the CPU 43. Therefore, the enough capacity of the electricity supply lines can be easily secured irrespective of the arrangement of the components while the electricity is supplied to a plurality of parts of the CPU 43. Moreover, the paste ground 72 has a sufficient area covering the whole control circuit 321a. That is, the capacity of returning lines for the electricity supply lines can be secured enough.

(Third Embodiment)

Figure 7:
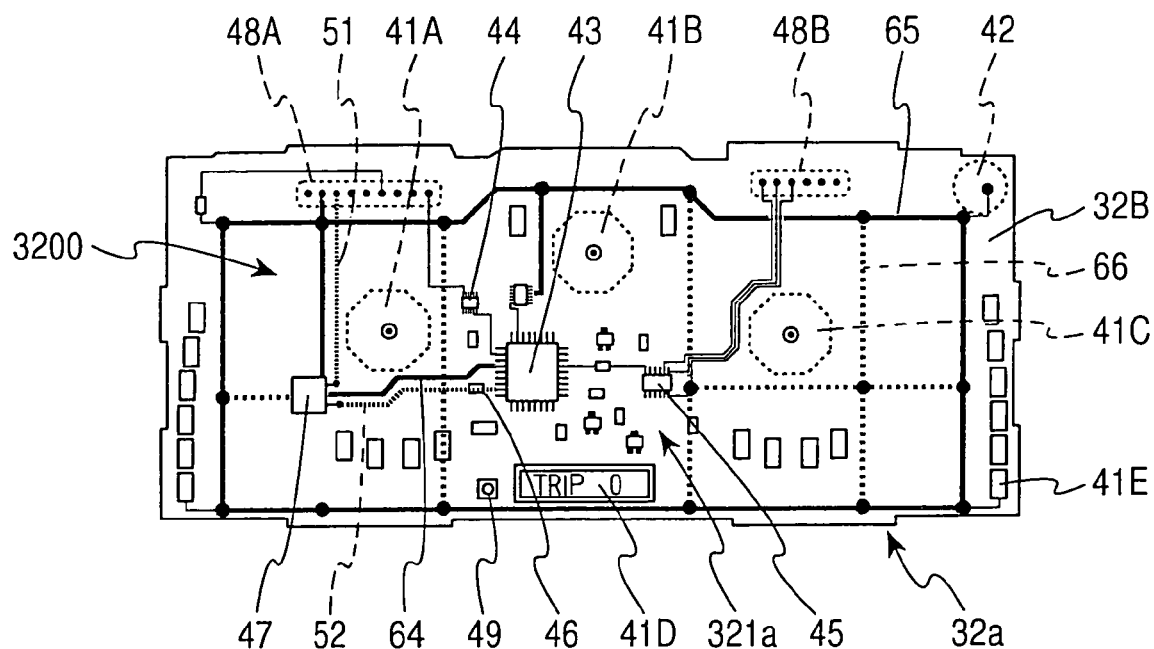
FIG. 7 is a diagram showing a component arrangement of a printed board of a meter unit according to a third embodiment of the present invention.
Figure 8:
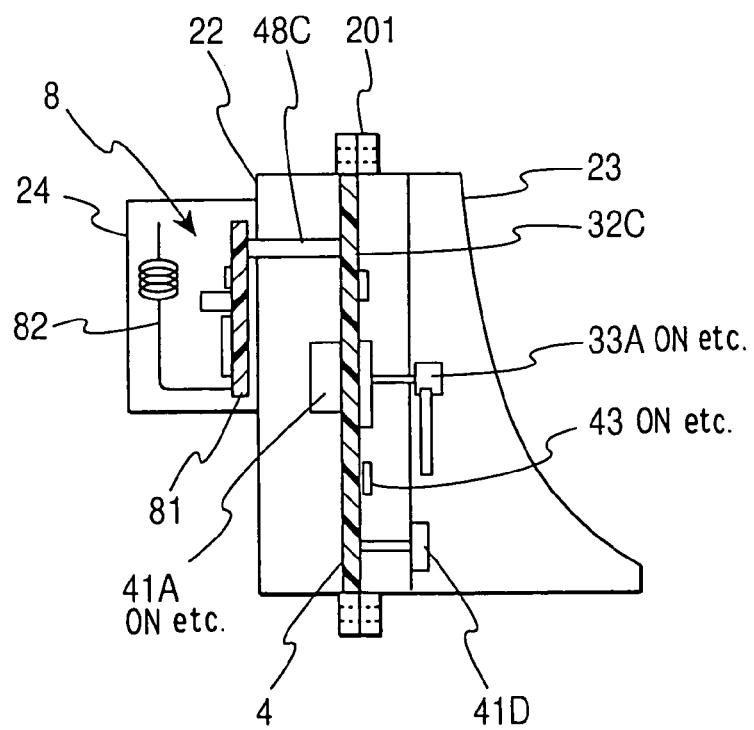
FIG. 8 is a cross-sectional view of a meter unit according to a modification of the third embodiment of the present invention.
Figure 9:
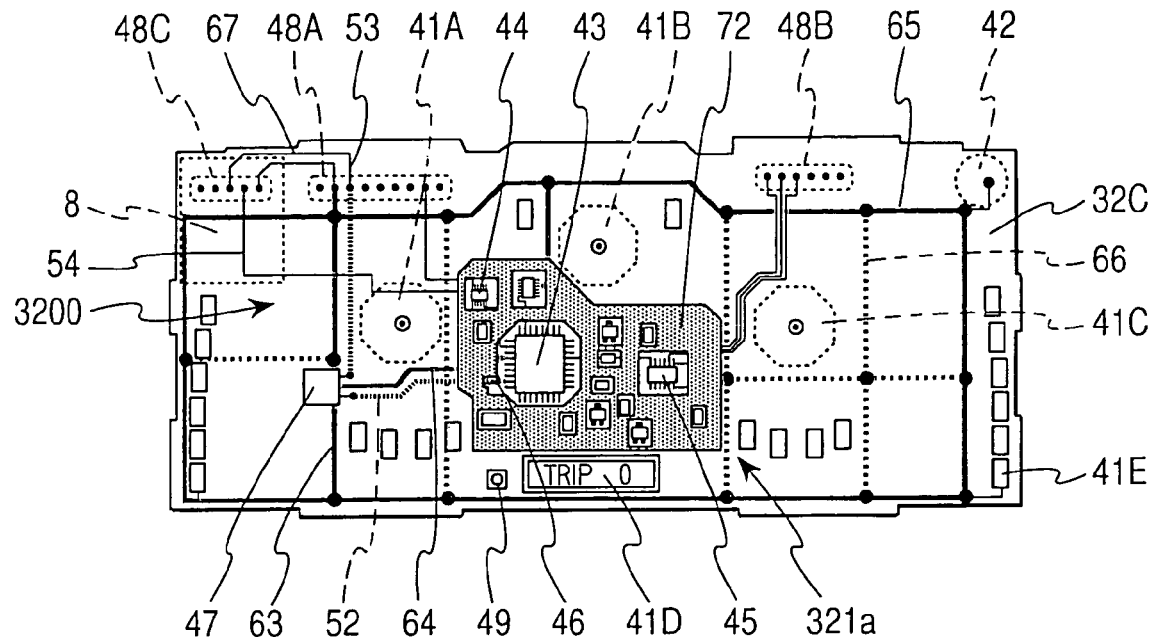
FIG. 9 is a diagram showing a component arrangement of a printed board according to the modification.

The third embodiment of the present invention will be described with reference to FIGS. 7, 8 and 9. The basic structure of a meter unit is the same as that of the first embodiment, and the differences between the first embodiment and the third embodiment will be particularly described.

The shape of a ground line 65 of a printed board 32B is different from that of the ground lines 61, 62 shown in FIG. 1, the ends of which are not connected. The shape of a ground line 65 is a continuous rectangular closed loop-shape, in which the ground lines 65 are extended along the edge of the printed board 32. The loop-shaped ground line 65 is connected with a ground terminal of a battery regulator 47 and a ground terminal of a connector 48A for supplying electricity.

Moreover, in this embodiment, as ground lines, ground lines 66 (hereinafter, according to need, referred to as a reinforcing groundlines) are formed. The ground line 66 is, for example, disposed inside the loop-shaped ground line 65 and connects the portions of the ground line 65 linearly extending in parallel. A plurality of the reinforcing ground lines 66 are formed to be longitudinally or transversely extended and electrically connected in their crossing parts.

The reinforcing ground lines 66 are, for example, formed by layering an electrically insulative membrane and an electrically conductive membrane similarly to the paste ground. Accordingly, a predetermined number of the reinforcing ground lines can be formed at predetermined positions irrespective of the arrangement of the components and the wirings on the printed board.

Moreover, the reinforcing ground line 66 may be formed to be aslant extended on the printed board.

The ground line 65 is formed to have a connected loop-shape. Therefore, the electric noise is restrained better than that of the one shown in FIG. 4 in which the ends of the ground line are not connected. Moreover, the reinforcing ground lined are formed, thereby lowering the grounding resistance and restraining the ground line from functioning as an antenna. Accordingly, sufficient effect for reducing the noise can be attained. Moreover, the pattern can be formed to have an elongated shape. Therefore, the structure can be simpler than that of one in which an electrically conductive membrane is formed wholly on the printed board.

Moreover, the above described embodiments can be applied to a meter unit having an electric wave receiver, such as a keyless entry receiver, is housed inside a meter housing thereof. FIGS. 8 and 9 show an example of such a meter unit, in which an antenna 82 is connected with a receiving circuit board 81 and receives an electric wave from an unshown keyless entry transmitter. The keyless entry receiver 8 and the keyless entry transmitter constitute an electric wave type keyless entry system, in which, for example, about 300 MHz electric waves are used.

The keyless entry receiver 8 is fixed on the printed board 32 on the opposite side of the indicative portion 3 with respect to the printed board 32. In addition, the keyless entry receiver 8 is disposed around the upper left corner of the printed board 32 so that the receiver circuit board 81 is placed on the printed board 32. A small housing 24 is attached on the lower housing 22A so as to correspond to the keyless entry receiver 8 and houses the keyless entry receiver 8.

A control signal corresponding to an operational command code demodulated by the keyless entry receiver 8 is outputted to a communicative IC 44 through a receiver connector 48C of a printed board 32C and a signal line 54, and is transmitted to an external ECU for controlling a communication network. The receiver connector 48C is connected with a battery regulator 47 through a battery line 53 and a ground line 67, and thereby electricity can be supplied to the keyless entry receiver 8.

In such a meter unit provided with the keyless entry receiver 8, by virtue of the reductive effect of noise caused by the CPU 43 or etc. of the printed board 32C, the keyless entry receiver 8 can be surely operated and operational area thereof can be enlarged.

(Fourth Embodiment)

Figure 10:
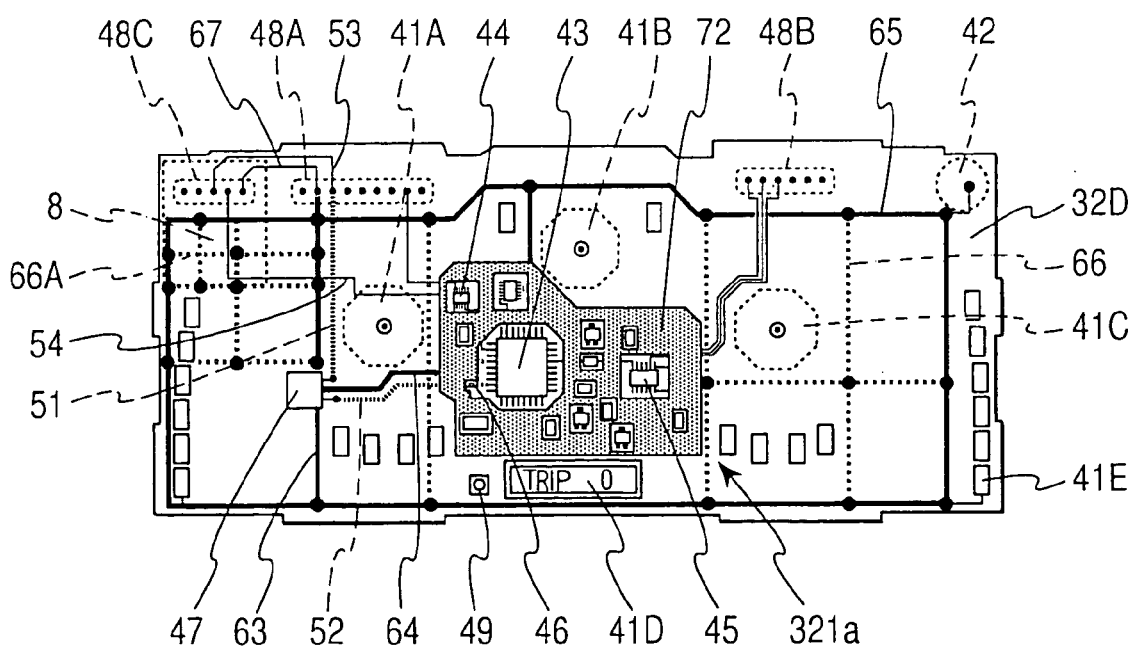
FIG. 10 is a diagram showing a component arrangement of a printed board of a meter unit according to a fourth embodiment of the present invention.

The fourth embodiment of the present invention will be described with reference to FIG. 10. The basic structure of a meter unit is essentially the same as that according to the second embodiment. The differences between this embodiment and the first embodiment will be particularly described.

On a printed board 32D, similar to the third embodiment, connective ground lines 66 and dense connective ground lines 66A that connect between the parts of the loop-shaped ground line 65 are provided. The dense connective ground lines 66A are installed densely at the area where the keyless entry receiver 8 is installed.

The closer to the keyless entry receiver 8 the noise source is disposed, the more the noise effects on the keyless entry receiver. However, since ground connections are performed enough at the area, the effect of the dispensable radiation noise to the keyless entry receiver can be sufficiently reduced.

Further, the present invention can be applied not only to a meter unit but to any other printed board in which a high frequency circuit having a high frequency signal source is installed. Furthermore, the present invention should not be limited to the embodiments previously discussed and shown in the figures, but may be implemented in various ways without departing from the spirit of the invention.

What is claimed is:

1. A printed board comprising:
   a board;
   a plurality of circuit components, which are installed in the board;
   a wiring pattern, which electrically connects between the circuit components, the wiring pattern including at least one ground pattern;
   an electric regulator for supplying a predetermined amount or electricity, the electric regulator being installed in the board;
   a high frequency circuit, which is installed in the board and operated by the electricity, the high frequency circuit including a high frequency signal source and at least one mounting component;
   an electrically insulative membrane installed on an area of the board where the high frequency circuit is installed, the electrically insulative membrane including at least one component hole pattern, which surrounds one of the high frequency signal source and the mounting component, and at least one connection hole pattern; and
   an electrically conductive membrane installed on the electrically insulative membrane and including a component hole pattern in a position corresponding to the at least one component hole pattern of the electrically insulative membrane to surround said one of the high frequency signal source and the mounting component, wherein the electrically conductive membrane is electrically connected with the ground pattern through the connection hole pattern.

2. A printed board according to claim 1 further comprising an electric pattern, through which the electricity is supplied to the high frequency signal source, wherein a portion of the electric pattern in the vicinity of the high frequency signal source is disposed between the high frequency signal source and the electrically conductive membrane so as to surround the high frequency signal source.

3. A printed board according to claim 1, wherein:
   the high frequency signal source is a CPU; and
   the high frequency circuit includes the CPU and at least one IC, which communicates data with the CPU.

4. A meter unit for a vehicle comprising:
   at least one meter housing;
   an indicative portion for indicating driving information of the vehicle, the indicative portion being disposed in a manner That opposes a passenger in the vehicle; and
   a printed board, which is installed inside the meter housing and includes a meter circuit for controlling a content indicated in the indicative portion correspondingly to an actual driving state of the vehicle, wherein the printed board is essentially composed of a printed board according to claim 1.

5. The printed circuit board of claim 1, wherein the component hole pattern of the electrically conductive membrane is co-extensive with the corresponding at least one component hole pattern of the electrically insulative membrane.

6. A printed board according to claim 2, wherein:
   the high frequency signal source is a CPU; and
   the high frequency circuit includes the CPU and at least one IC, which communicates data with the CPU.

7. A meter unit for a vehicle comprising:
   at least one meter housing;
   an indicative portion for indicating driving information of the vehicle, the indicative portion being disposed in a manner that opposes a passenger in the vehicle; and
   a printed board, which is installed inside the meter housing and includes a meter circuit for controlling a content indicated in the indicative portion correspondingly to an actual driving state of the vehicle, wherein the printed board is essentially composed of a printed board according to claim 2.

8. A meter unit for a vehicle comprising:
   at least one meter housing;
   an indicative portion for indicating driving information of the vehicle, the indicative portion being disposed in a manner that opposes a passenger in the vehicle; and
   a printed board, which is installed inside the meter housing and includes a meter circuit for controlling a content indicated in the indicative portion correspondingly to an actual driving state of the vehicle, wherein the printed board is essentially composed of a printed board according to claim 3.

9. A meter unit according to claim 4, wherein:
   the high frequency signal source is a CPU; and
   the mounting component is one of a communicative IC, which communicates data multiply with the CPU and an external communicative network, and a parallel-serial conversion IC, which converts a parallel signal into a serial signal.

10. A meter unit for a vehicle comprising:
    at least one meter housing;
    an indicative portion for indicating driving information of the vehicle, the indicative portion being disposed in a manner that opposes a passenger in the vehicle; and
    a printed board, which is installed inside the meter housing and includes a meter circuit for controlling a content indicated in the indicative portion correspondingly to an actual driving state of the vehicle, wherein the printed board is essentially composed of a printed board according to claim 6.

11. A meter unit according to claim 7, wherein:
    the high frequency signal source is a CPU; and
    the mounting component is one of a communicative IC, which communicates data multiply with the CPU and an external communicative network, and a parallel-serial conversion IC, which converts a parallel signal into a serial signal.

12. A meter unit according to claim 8, wherein:
    the high frequency signal source is a CPU; and
    the mounting component is one of a communicative IC, which communicates data multiply with the CPU and an external communicative network, and a parallel-serial conversion IC, which converts a parallel signal into a serial signal.

13. A meter unit according to claim 10, wherein:
    the high frequency signal source is a CPU; and
    the mounting component is one of a communicative IC, which communicates data multiply with the CPU and an external communicative network, and a parallel-serial conversion IC, which converts a parallel signal into a serial signal.

* * * * *